United States Patent
Eibl

(10) Patent No.: US 9,202,729 B2
(45) Date of Patent: Dec. 1, 2015

(54) HYBRID CHUCK

(75) Inventor: Markus Eibl, Munich (DE)

(73) Assignee: ATT Systems GmbH (DE)

( * ) Notice: Subject to any disclaimer, the term of this patent is extended or adjusted under 35 U.S.C. 154(b) by 1604 days.

(21) Appl. No.: 11/991,028

(22) PCT Filed: Oct. 17, 2006

(86) PCT No.: PCT/EP2006/010019
§ 371 (c)(1),
(2), (4) Date: Apr. 16, 2008

(87) PCT Pub. No.: WO2007/045444
PCT Pub. Date: Apr. 26, 2007

(65) Prior Publication Data
US 2009/0250202 A1 Oct. 8, 2009

(30) Foreign Application Priority Data

Oct. 17, 2005 (DE) .......................... 10 2005 049 598

(51) Int. Cl.
*G05D 23/00* (2006.01)
*H01L 21/67* (2006.01)
*F28D 15/00* (2006.01)

(52) U.S. Cl.
CPC .... *H01L 21/67109* (2013.01); *H01L 21/67103* (2013.01); *H01L 21/67248* (2013.01); *F28D 15/00* (2013.01)

(58) Field of Classification Search
CPC .............. F28D 15/00; H01L 21/67109; H01L 21/67248; H01L 21/67103; H01L 35/00; H01L 37/00; F25B 21/02

USPC ............... 62/3.2, 3.3, 3.7, 259.2; 165/104.21, 165/104.23, 104.27, 104.33; 361/699, 700
See application file for complete search history.

(56) References Cited

U.S. PATENT DOCUMENTS

| | | | | |
|---|---|---|---|---|
| 3,071,185 A | * | 1/1963 | Simmons | 165/258 |
| 5,441,104 A | * | 8/1995 | Ehr et al. | 165/104.32 |
| 5,660,047 A | | 8/1997 | Paganessi | |
| 5,665,166 A | * | 9/1997 | Deguchi et al. | 118/723 E |
| 5,950,723 A | | 9/1999 | Heimanson et al. | |
| 6,434,955 B1 | * | 8/2002 | Ng et al. | 62/106 |
| 7,108,471 B2 | | 9/2006 | Osuga | |
| 7,235,137 B2 | | 6/2007 | Kitayama et al. | |
| 7,604,042 B2 | | 10/2009 | Yamazaki | |
| 2005/0016467 A1 | | 1/2005 | Hsiao et al. | |
| 2005/0133157 A1 | * | 6/2005 | Choi | 156/345.27 |
| 2006/0027169 A1 | | 2/2006 | Tsukamoto et al. | |

FOREIGN PATENT DOCUMENTS

JP H04167516 A * 6/1992
JP H1041376 A * 2/1998

* cited by examiner

*Primary Examiner* — M. Alexandra Elve
*Assistant Examiner* — Larry Furdge
(74) *Attorney, Agent, or Firm* — Gerald E. Hespos; Michael J. Porco; Matthew T. Hespos

(57) ABSTRACT

Device and method for regulating the temperature of a substrate, in particular of a wafer, by means of a device comprising two temperature-regulating circuits that are operated with different temperature-regulating fluids.

12 Claims, 2 Drawing Sheets

HYBRID CHUCK

BACKGROUND OF THE INVENTION

1. Field of the Invention

The invention relates to an apparatus and a method for regulating the temperature of a substrate and in particular for regulating the temperature of a wafer.

2. Description of the Related Art

Holding apparatuses and in particular wafer chucks, which mostly have a planar bearing surface for the wafer-type substrates, are customarily used for testing circuit arrangements on wafer-type substrates, such as semiconductor wafers, for example. It is necessary for a large number of electrical measurements for testing a substrate to adjust the temperature of the substrate to a constant predetermined value and/or to maintain it at a constant predetermined value.

For this purpose, heating and/or cooling elements are formed in a substrate holding apparatus or the holding apparatus is combined with a conventional thermochuck. In order to transfer the regulated temperature of the apparatus also to the substrate, the substrate must be in good thermal contact with the bearing surface of the holding apparatus. To this end, in conventional substrate holding apparatuses vacuum openings, for example, are formed in the contact surface in order to enable the substrate to be sucked up. Conventional substrate holding apparatuses are provided with a closed cooling circuit in which a cooling fluid circulates through ducts in the substrate holding apparatus to a heat exchanger and back again to the substrate holding apparatus. Since a closed circuit only comprises a fixed, non-expandable volume, it may be possible depending on the cooling fluid at relatively high operating temperatures that high pressures occur in the circuit such that the substrate holding apparatus and/or parts of the cooling circuit are subjected to high stresses. Consequently, the risk of failure increases and, for example, the seals in the circuit must in conventional appliances be designed to be particularly resistant to pressures, which incurs corresponding expenses. Moreover, appliances of this type regularly need to be serviced which involves a high degree of complexity.

It is an object of the present invention to provide an inexpensive and reliable regulation of the temperature of substrates and in particular of semiconductor wafers, wherein desired changes in temperature can be carried out quickly and precisely.

The object is achieved by virtue of the features of the independent claims. Preferred embodiments are the subject matter of the dependent claims.

SUMMARY OF THE INVENTION

Thus, the object is achieved according to the invention by virtue of an apparatus for regulating the temperature of a substrate, in particular of a wafer, wherein the apparatus has a base or main body whose temperature is regulated by a first temperature-regulating apparatus and a second temperature-regulating device, wherein the first temperature-regulating device is used to regulate the temperature of the main body in a first temperature range between a first temperature and a second temperature, with the first temperature being lower than the second temperature, and is temperature-regulated using a first temperature-regulating fluid, and the second temperature-regulating device is used to regulate the temperature of the main body in a second temperature range between a third temperature and a fourth temperature, with the third temperature being lower than the fourth temperature, and the second temperature-regulating device is temperature-regulated using a second temperature-regulating fluid, wherein the second temperature is lower than the fourth temperature and the first temperature-regulating fluid is different from the second temperature-regulating fluid. This has the advantage that the first and second temperature-regulating fluids can be chosen appropriately, in each case for a specific operating range, according to the desired physical characteristics, such as the pressure- and temperature-dependent aggregate states (solid, fluid, gaseous), the desired flow characteristics (viscosity, tendency to change into turbulent flows etc.), heat capacity, thermal conductivity, heat transition at specific solid surfaces and/or dew points of gases with condensable proportions and so on. Each of the two temperature-regulating devices can be operated in a range in which the other temperature-regulating device with the other temperature-regulating fluid would be less suitable. The overall temperature range within which the apparatus is operated is preferably between a first temperature of approximately −75° C. (198.15 Kelvin) and a fourth temperature of approximately 400° C. (673.15 Kelvin). The second temperature is preferably 300° C. (573.15 Kelvin), better yet approximately 200° C. (473.15 Kelvin) and most advantageously approximately 100° C. (373.15 Kelvin). The third temperature preferably lies within the range of the first temperature, but may also be higher up to within the range of the second temperature. Operation of the second temperature-regulating apparatus up to a temperature of within the range of the first temperature has the advantage that then the first and the second temperature-regulating devices can operate at the same time up to said range and thus contribute to quicker temperature changes. Operating the second temperature-regulating device up to a lower third temperature (just) below the second temperature can be advantageous, for example, if parameters such as the dew point of a gaseous temperature-regulating fluid need to be taken into consideration. At a higher third temperature is not necessary in such a case to dry the used gas as strongly as would be necessary at lower temperatures.

In such an apparatus the first temperature-regulating fluid is preferably a liquid alcohol. The first temperature-regulating fluid is even more preferably a thermal oil on silicone-oil basis. It is most preferable to use a temperature-regulating fluid which contains perfluorinated polyether, poly(oxyperfluoro-n-alkylene) and/or a mixture of triethoxyalkylsilanes.

An apparatus in which the second temperature-regulating fluid is air or nitrogen is also advantageous.

In another preferred apparatus, the first temperature-regulating device has a first temperature-regulating means circuit, which is advantageously substantially closed, through which a first temperature-regulating fluid flows in order to regulate the temperature, wherein the first temperature-regulating means circuit is designed such that the first temperature-regulating fluid, once it has flowed through the region of the temperature-regulated main body, remains in the temperature-regulating means circuit at least partially at least in the operating range between the first temperature and the second temperature. This has the advantage that a temperature-regulating fluid does not need to be replaced after use, but can be used again at least partially. Another advantage is that the fluid—at least in stationary operation, that is to say if a set temperature is intended to be maintained—has, if it leaves the range to be temperature-regulated, a temperature which is negligibly above or below the entry temperature with the result that in an external temperature-regulating apparatus, in which the fluid is meant to be brought to entry temperature, only a small temperature difference needs to be equalized, which can save energy. In order to equalize pressure peaks it is advantageously possible to provide a pressure-relief valve. Advantageously, it is further possible that in a closed circuit even those fluids can be used which must not escape into the surrounding area because they can have disadvantageous effects on the environment or on parts of the equipment.

An apparatus of the type in which the first temperature-regulating fluid in the temperature range between the first temperature and the second temperature up to a prespecified first maximum pressure has a liquid aggregate state is furthermore preferred. This has the advantage that the heat transfer coefficient of liquids on solid walls is generally higher than the heat transfer coefficient of gases on solid walls. It is possible, for example, in the case of a prespecified area, for more heat to be transferred per unit time when using liquid fluids so that a specific temperature can be adjusted more quickly than when using gaseous fluids.

Advantageously, an apparatus according to the invention is designed such that that part of the first temperature-regulating means circuit which is situated in the region of the temperature-regulated main body preferably can, via a shut-off valve, be shut off from the remaining region of the first temperature-regulating circuit and/or be connected to a pressure-relief region. This has the advantage, for example, that in a first temperature range of the temperature-regulated main body, in which the fluid pressure of the used first temperature-regulating fluid would exceed a permissible maximum pressure, that region of the temperature-regulating means circuit which is subjected to this temperature, can be emptied at least partially or can be connected to a, pressure-relief region (such as a reservoir or a surge tank) so that an increase in pressure above a predetermined or predeterminable value is prevented.

Furthermore, an apparatus in which the second temperature-regulating device for regulating the temperature of the main body has a second closed temperature-regulating means circuit, through which a second temperature-regulating fluid flows in order to regulate the temperature, is preferred. With respect to the advantages of such an embodiment, reference can be made to the statements made with respect to the first temperature-regulating device.

In an apparatus according to the invention, the second temperature-regulating fluid advantageously has, in the temperature range between the third temperature and the fourth temperature, a liquid aggregate state up to a prespecified second maximum pressure. With respect to the advantages of such an embodiment, reference can be made to the statements made with respect to the first temperature-regulating device.

An apparatus in which the second temperature-regulating fluid has, in the temperature range between the third temperature and the fourth temperature, a liquid or a gaseous aggregate state is also advantageous. This has the advantage that pressure peaks in the circuit can be avoided more easily than is the case in a liquid fluid. Furthermore, a gaseous fluid can be used to realize higher flow rates, so that it is also possible in heat transfer coefficients for "gases on walls" for large flows of heat to be realized. In particular in an operating range in which the main body is intended to be cooled down from a temperature which is above the second temperature—that is to say in a range in which the first temperature-regulating device cannot be operated on account of the high pressures—it is also possible, due to the large temperature differences between the temperature-regulating fluid and main body which generally prevail in this case, for an effective cooling effect to be achieved by way of a gas flow.

In a particularly preferred apparatus, the second temperature-regulating device for regulating the temperature of the main body has a temperature-regulating body and an incident-flow apparatus, wherein the incident-flow apparatus is designed such that it can cause the flow of a second temperature-regulating fluid to be incident on the temperature-regulating body, wherein the second temperature-regulating apparatus is designed such that the second temperature-regulating fluid is not returned again into a temperature-regulating fluid circuit after it was incident on the temperature-regulating body. An advantage of this open system is that the ambient space around the temperature-regulating apparatus can be conditioned via the emerging fluid. Another advantage is the simple manner of construction, by means of which such an apparatus can be produced more cheaply. Maintenance costs could also be reduced in this embodiment if for example technical gases, which can be produced on an industrial scale, or compressed ambient air are used as cooling fluid. A simple cooling effect can be achieved in both cases by way of the sudden pressure drop when the gas flows out of the pressure vessel, in particular if rapid cooling of the main body is necessary without adjustment of the temperature to a specific value.

An apparatus of this type particularly preferably further has an electric temperature-regulating apparatus. Advantages of such an apparatus are, for example, simple handling, freedom from maintenance, control rate and costs of electric temperature-regulating apparatuses, in particular of electrical heating elements.

Advantageously, the electric temperature-regulating apparatus has a Peltier element which is designed as an areal separating layer between the first and the second temperature-regulating devices. The use of a Peltier element has the advantage that it can be used, depending on the polarity of a connected power supply or circuit arrangement, both for heating and for cooling the main body or for measuring the temperature. The Peltier element can preferably also be used in conjunction with one or more other electric temperature-regulating apparatuses.

Also preferred is an apparatus of the type in which the electric temperature-regulating apparatus has a sufficiently good thermal conductivity in order to enable heat passage between the first and second temperature-regulating devices even in the passive state, i.e. in order to enable that the substrate which is applied on the first temperature-regulating apparatus can be cooled or heated over a temperature difference of the second temperature-regulating apparatus.

The object is also achieved according to the invention by way of a method for regulating the temperature of a substrate, in particular of a wafer, comprising the following steps:

determining a predetermined temperature of a main body on which the substrate whose temperature is to be regulated is applied, or of the substrate whose temperature is to be regulated, measuring or detecting the actual temperature of a main body on which the substrate whose temperature is to be regulated is applied, or of the substrate whose temperature is to be regulated, comparing of the measured or detected actual temperature with a predetermined or predeterminable and/or stored limit temperature, regulating the temperature of the main body at least using a first temperature-regulating apparatus if the measured actual temperature is lower by a first predetermined amount than the stored limit temperature, bringing the first temperature-regulating apparatus into a rest state, or keeping it there, and regulating the temperature of the main body using another temperature-regulating apparatus if the measured actual temperature is higher by a second predetermined amount than the stored limit temperature.

The invention will be described below by way of example with reference to accompanying drawings of preferred embodiments. These and other objects, features and advantages of the present invention can be understood more easily using the following detailed description of preferred embodiments and the accompanying drawings. These should be understood such that the features of the different embodiments, even if they are described merely with reference to individual embodiments, can be combined with one another such that further embodiments result. The embodiments are also illustrated with features which are merely preferred but do not necessarily need to be present.

DETAILED DESCRIPTION OF THE PREFERRED EMBODIMENTS

Figure 1:
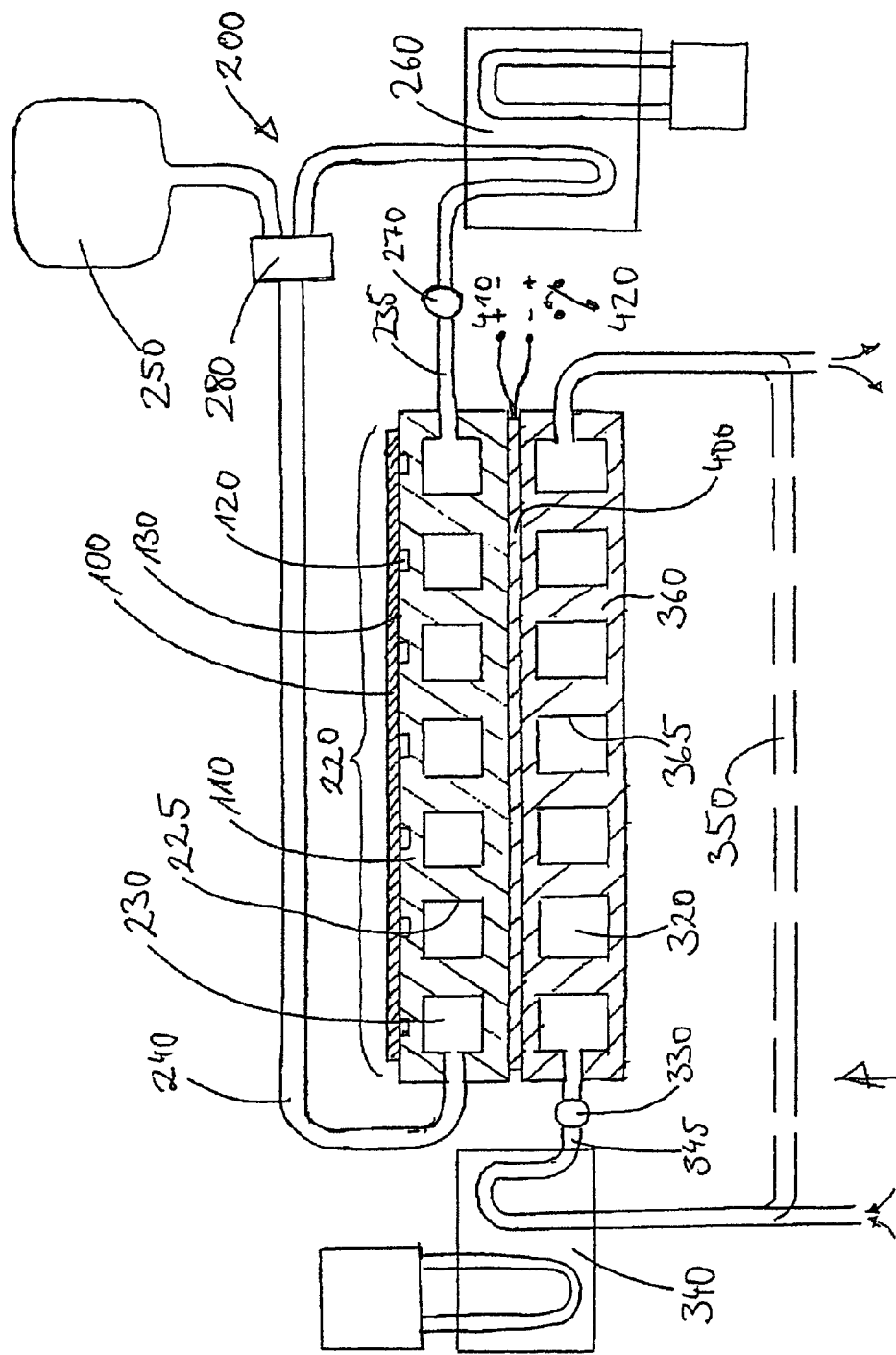
FIG. 1 shows a cross section of a preferred embodiment of an apparatus of the invention for regulating the temperature of a substrate according to a first embodiment.

FIG. 1 shows a cross section of a preferred embodiment of the apparatus of the invention for regulating the temperature of a substrate 100 (thermochuck) and in particular of a wafer. Here, a main body 110 has a substantially planar contact surface 130 with an attachment device which has, in the illustrated embodiment, a large number of suction grooves 120 or suction ducts. Said suction grooves 120 are connected via vacuum ducts (not illustrated) which are formed inside the main body 110 to at least one vacuum connector (likewise not illustrated). These vacuum grooves 120 can be used to suck a substrate 100, which is to be arranged on the contact surface, in the direction of the contact surface and to keep it on the contact surface. Due to the suction, the substrate 100 is pressed against the contact surface 130 of the main body or of the bearing table 110 or arranged thereon, as a result of which a good heat transfer coefficient between the main body 110 and the substrate 100 is ensured.

Situated in an adjoining manner on the main body 110 is the first temperature-regulating device 200. In the illustrated embodiment, the first temperature-regulating device 200 is integrally connected in the region of the temperature-regulated main body 220 to the main body 110. The region of the temperature-regulated main body 220 has one or more first temperature-regulating means ducts 225 inside the main body 110. A first temperature-regulating fluid 230 circulates or flows in a first temperature-regulating means circuit 210, which is part of the temperature-regulating device 110, to be more precise through said first temperature-regulating means ducts 225, from there at least into one first recirculation line 240, from there into at least one first heat exchanger 260, from there into at least one first supply line 235 and from there back into the first temperature-regulating means ducts 225 in the region of the temperature-regulated main body 220.

In the first temperature-regulating means circuit 210, a first fluid pump (not illustrated) preferably ensures the desired circulation of the first temperature-regulating fluid 230.

In the illustrated embodiment, an electric temperature-regulating apparatus with a power supply 410, which can for example be made of heating wires or the like, with the electric temperature-regulating apparatus being designed in the illustrated embodiment in a substantial areal manner, is located below the region of the temperature-regulated main body 220.

In the illustrated embodiment, the electric temperature-regulating apparatus 400 has a Peltier element and the power supply has a DC supply 410. Depending on the polarity of the DC supply 410, heat can be transported through the Peltier element from the upper surface to the lower surface or vice versa. At the same time, the Peltier element can be used as a temperature sensor because in a Peltier element, at different temperatures, a measurable current flows on both sides of the element.

Located below the electric temperature-regulating apparatus 400 in the illustrated embodiment is a temperature-regulating body 360 which substantially corresponds in the illustrated embodiment to the region of the temperature-regulated main body 220. The temperature-regulating body 360 also has one or more second temperature-regulating means ducts 365 inside it. On the side of a temperature source, which in the illustrated embodiment is designed as second heat exchanger 340, the temperature-regulating means ducts 365 are connected to at least one second supply line 345 while they are connected, on the downstream side) to at least one discharge line which is illustrated in the illustrated embodiment by dashed lines as second recirculation line 350. That means that in the illustrated embodiment, the second temperature-regulating device is likewise illustrated as a second temperature-regulating means circuit 310 in which a second temperature-regulating fluid 320 circulates from the second heat exchanger 340 into the second supply line 345, through the second temperature-regulating means ducts 365 into the second recirculation line 350 and back into the second heat exchanger 340.

Alternatively, the second temperature-regulating means device can also have an open design, so that the second temperature-regulating fluid 320 in the temperature source is brought to a desired temperature, flows past the temperature-regulating body 360 or through it and is subsequently discharged without being recirculated again into the temperature source. Here, the second temperature-regulating fluid 320 can either be removed completely from the apparatus or can be used to condition the space around the apparatus.

In principle, the fluids for the first temperature-regulating fluid and/or the second temperature-regulating fluid can be any conventional fluids which are liquid and/or gaseous in the respective temperature ranges within which they are used. Since the thermochuck, however, is meant for use in a very large temperature range of from approximately −75° C. to 400° C., the first and second temperature-regulating apparatuses are operated in the illustrated embodiment in different, preferably overlapping temperature ranges. The aim is here that the operating pressures within the temperature-regulating means circuits do not exceed 10 bar when water is used as the temperature-regulating means fluid. When other liquid temperature-regulating means fluids are used, the aim is that 4-5 bar is not exceeded; in the case of gaseous fluids, the value should not lie above 6-7 bar. Higher maximum operating pressures can likewise be realized, but require relevant structural measures in order to counteract the increased load.

It is thus possible for the first temperature-regulating device 200 to be designed for use in the first temperature range between a first temperature of, for example, −75° C. and a second temperature of, for example, 100° C. using the first temperature-regulating fluid 230, and for the second temperature-regulating device 300 to be designed for use in the second temperature range, which spans from a third temperature of approximately 50° C. to a fourth temperature of approximately 200° C., preferably using another (the second) temperature-regulating fluid 320. The temperatures can, of course, deviate from those mentioned, depending on the embodiment. In particular, the fourth temperature can be, for example, up to approximately 400° C.

In the illustrated temperature range, in the described embodiment, the first temperature-regulating fluid 230 used is a fluid which is in the liquid form in said first temperature range and has a viscosity which is low enough that it can circulate through the apparatus with low flow resistance. Examples of suitable fluids are, for example, various alcohols such as amyl alcohol (pentanol) and methanol, but also heptane. Particularly suited is a thermal oil on silicone-oil basis. Preferably, a temperature-regulating fluid is used which contains perfluorinated polyether (e.g. available under the trademark Galden HT from Solvay Solexis S.p.A.), poly(oxyperfluoro-n-alkylene) (for e.g. available under the trademark Galden ZT from Solvay Solexis S.p.A) and/or a mixture of triethoxyalkylsilanes (e.g. available under the trademark DW-Therm from DWS Synthesetechnik). Other substances known to a person skilled in the art can, however, also be used. Since above the second temperature the substances mentioned can only be kept in the liquid state under significant pressure, in the illustrated embodiment operation of the first temperature-regulating means circuit 210 is stopped above the second temperature. Since the first temperature-regulating fluid 230, which remains in the region of the temperature-regulated main body 220, would transition into the gaseous state with increasing temperature, suitable precautions can be taken in order to prevent an impermissible increase in pressure in the first temperature-regulating means circuit. For this purpose, the region of the temperature-regulated main body 220 can be separated from the rest of the first temperature-regulating means circuit 210 for example via a shut-off valve 270 and a three-way valve 280. Since the first temperature-regulating fluid 230 which remains in the first temperature-regulating means ducts 225 in the region of the temperature-regulated main body 220 would nevertheless be heated as well and would lead to a corresponding increase in pressure, it is possible in order to relieve the pressure for the first temperature-regulating means ducts 225 to also be connected, via the three-way valve 280, to a pressure-relief region 250 which in the illustrated preferred embodiment is in the form of a reservoir or an expansion container. In the same way, it is possible to open the region to the surrounding area, to pump out the first temperature-regulating fluid and/or to replace it with another fluid.

In the temperature range above the second temperature, the temperature of the apparatus is regulated substantially via the second temperature-regulating device 300 and/or via the electric temperature-regulating apparatus. As already illustrated with respect to the first temperature-regulating device 200, this can likewise be carried out via a suitable liquid second temperature-regulating fluid 320; due to the associated structural and economic advantages, a gaseous fluid, in particular air, has proven particularly advantageous. Especially in a temperature range above $-40°$ C. it is possible with an acceptable technical outlay for air to be dried to a relative air humidity which substantially does not yet result in undesired formation of condensation at ambient pressure. Further drying is likewise possible, with the result that the second temperature-regulating device 300 can be used in principle even up to the first temperature and beyond. The temperature of air can also be regulated easily, air can be heated in virtually any way, compressed, is available everywhere and without additional costs and is non-toxic.

Figure 2:
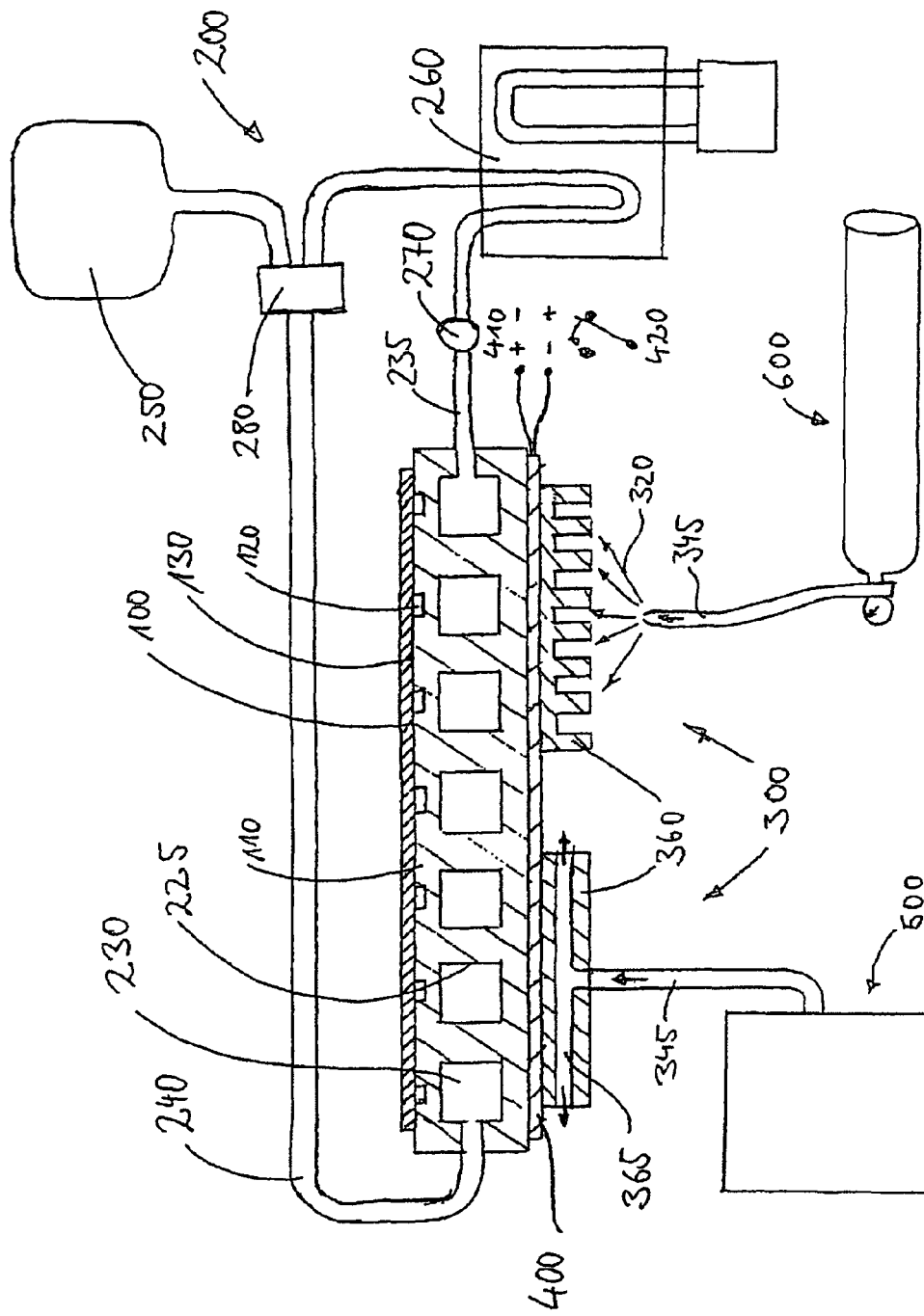
FIG. 2 shows a cross section of a preferred embodiment of an apparatus of the invention for regulating the temperature of a substrate according to a second embodiment.

If rapid cooling of the apparatus is desired, air can, for example, quickly be let out of a possibly pre-cooled pressure vessel 600 so that the rapid pressure drop causes cooling without the need to cool the air in a heat exchanger or another temperature-regulating apparatus, as is shown in the embodiment in FIG. 2 on the right-hand side. In FIG. 2, comparable features are denoted by identical reference symbols, as in FIG. 1. The achievable fluid temperatures are generally completely adequate for cooling the apparatus in a high temperature range, in particular in a range above the second temperature, due to the large difference in temperatures. Other gases, such as nitrogen, can of course also be used besides air.

If the second temperature-regulating device 300 is used as an open system, which sucks in surrounding air from the space around the apparatus, for example, via an air-treatment system 500, dries it to a desired value, if desired compresses it and regulates its temperature and is allowed to flow back into the space past the temperature-regulating body 360, then is it additionally possible to condition the area surrounding the apparatus via the second temperature-regulating apparatus 300.

In an embodiment of the second temperature-regulating apparatus 300 as an open system, the temperature-regulating body can also be designed without closed second temperature-regulating means ducts 365, for example with cooling ribs on which an incident-flow apparatus, such as a pressure vessel 600 with a connected air nozzle, a fan etc., blows air, as is shown in FIG. 2 on the right-hand side. Preferably, however, a number of ducts are formed in the temperature-regulating body centrally starting from one or a few entry openings, which ducts issue in a large number of fluid exit openings, as is shown in FIG. 2 on the left-hand side. This can effect a particularly efficient distribution of the fluid flow over the entire region of the temperature-regulated main body.

The two temperature-regulating devices can also be used at the same time in the overlapping temperature range so that, if used together, they can lead to even quicker changes in temperatures. In the same way, operation in which, in addition to the first and/or the second temperature-regulating apparatus 200, 300, the electric temperature-regulating apparatus 400 is used, is conceivable. It is further conceivable to use the second temperature-regulating apparatus 300 merely as a cooling apparatus if rapid cooling processes are required.

The materials of the main body, of the first and second temperature-regulating devices and/or of individual parts comprise in a non-limiting manner steel, other metals and ceramic. Particularly preferred design options of these parts, also with respect to the path of the flow ducts, are described in detail for example in DE 20 2005 005 052. The ducts can additionally, as is likewise described for example in DE 20 2005 005 052, also have coatings which shield the substrate for example from electromagnetic fields. Therefore, reference is expressly made to said document. It is furthermore advantageous if the described apparatus has a housing, for example to protect against ingress of dirt and/or mechanical influences or against the exit of fluids from the inside of the apparatus.

The invention claimed is:

1. An apparatus for regulating the temperature of a substrate (100), comprising:
a first temperature-regulating device (200) having a main body (110) with a contact surface (130) having suction grooves (120) that suck the substrate (100) against the contact surface (130) and a non-contact surface opposite the contact surface, at least one first temperature-regulating duct (225) inside of the main body (110) for accommodating a first temperature-regulating fluid (230) to regulate a temperature in a first temperature range between a first temperature and a second temperature, with the first temperature being lower than the second temperature, and a second temperature-regulating device (300) having a temperature-regulating body (360) with a surface facing the non-contact surface of the main body (110) and at least one second temperature-regulating duct (365) inside the temperature-regulating body (360) for accommodating a second temperature-regulating fluid (320) that is different from the first temperature regulating fluid to regulate the temperature of the main body (110) in a second temperature range between a third temperature and a fourth temperature, with the second and third temperatures being lower than the fourth temperature, the first and second temperature-regulating devices (200, 300) being closed with respect to one another so that the first temperature-regulating fluid (230) does not directly contact the temperature-regulating body of the second temperature-regulating device (300) and so that the second temperature-regulating fluid (320) does not directly contact the at least one first temperature-regulating duct (225), and an electric temperature-regulating apparatus (400) in face-to-face contact with the non-contact surface of the main body (110) and with the surface of temperature-regulating body (360) that faces the non-contact surface of the main body (110) to define an areal separating layer between the first and the second temperature-regulating devices, the electric temperature-regulating apparatus (400) having a Peltier element configured to function as a temperature sensor in view of measurable current flows on opposite sides of the Peltier element that vary as a function of temperature and being configured to cause a heat transfer toward a selected one of the first and second temperature regulating devices in accordance with a sensed temperature.

2. The apparatus as claimed in claim 1, in which the first temperature-regulating fluid (230) contains alcohol, a thermal oil on silicone-oil basis, perfluorinated polyether, poly(oxyperfluoro-n-alkylene) and/or a mixture of triethoxyalkylsilanes.

3. The apparatus as claimed in claim 1, in which the second temperature-regulating fluid (320) is air or nitrogen.

4. The apparatus as claimed in claim 1, wherein the first temperature-regulating device (200) has a first temperature-regulating means circuit (210), through which the first temperature-regulating fluid (230) flows in order to regulate the temperature, wherein the first temperature-regulating means circuit (210) is designed such that once the first temperature-regulating fluid (230) has flowed through the region of the temperature-regulated main body (220), remains in the first temperature-regulating means circuit (210) at least partially at least in the operating range between the first temperature and the second temperature.

5. The apparatus as claimed in claim 4, wherein the first temperature-regulating fluid (230) in the temperature range between the first temperature and the second temperature up to a prespecified first maximum pressure has a liquid aggregate state.

6. The apparatus as claimed in claim 5, which is designed such that the part of the first temperature-regulating means circuit (210) which is situated in the region of the temperature-regulated main body (220) can be shut off from the remaining region of the first temperature-regulating circuit (210) and be connected to a pressure-relief region (250).

7. The apparatus as claimed in claim 1, wherein the second temperature-regulating device (300) for regulating the temperature of the main body (110) has a second closed temperature-regulating means circuit (310) through which the second temperature-regulating fluid (320) flows in order to regulate the temperature.

8. The apparatus as claimed in claim 7, wherein the second temperature-regulating fluid (320) has, in the temperature range between the third temperature and the fourth temperature, a liquid aggregate state up to a prespecified second maximum pressure.

9. The apparatus as claimed in claim 7, wherein the second temperature-regulating fluid (320), in the temperature range between the third temperature and the fourth temperature, has a gaseous aggregate state.

10. The apparatus as claimed in claim 1, wherein the second temperature-regulating device (300) for regulating the temperature of the main body has an incident-flow apparatus (500, 600), wherein the incident-flow apparatus (500, 600) is designed such that the flow of the second temperature-regulating fluid (320) can be caused to be incident on the temperature-regulating body (360), wherein the second temperature-regulating apparatus (300) is designed such that the second temperature-regulating fluid (320) is not returned again into a temperature-regulating fluid circuit after the second temperature-regulating fluid (320) was incident on the temperature-regulating body (360).

11. The apparatus as claimed in claim 1, wherein the electric temperature-regulating apparatus (400) has a sufficiently good thermal conductivity in order to enable heat passage between the first and second temperature-regulating devices even in the passive state.

12. The apparatus as claimed in claim 1, in which the first temperature is approximately −75° C. (198.15 Kelvin) and the fourth temperature is approximately 400° C. (673.15 Kelvin) and the second temperature is between 300° C. (573.15 Kelvin) and 100° C. (373.15 Kelvin) and in which the third temperature is preferably in the range of the first temperature and 45° C.

* * * * *